US012222537B2

(12) United States Patent
Traub et al.

(10) Patent No.: US 12,222,537 B2
(45) Date of Patent: Feb. 11, 2025

(54) SURFACE RELIEF WAVEGUIDES WITH HIGH REFRACTIVE INDEX RESIST

(71) Applicant: Magic Leap, Inc., Plantation, FL (US)

(72) Inventors: Matthew C Traub, Sterrebeek (BE); Yingnan Liu, Sunnyvale, CA (US); Vikramjit Singh, Pflugerville, TX (US); Frank Y. Xu, Austin, TX (US); Robert D. Tekolste, Boulder, CO (US); Qizhen Xue, Austin, TX (US); Samarth Bhargava, Saratoga, CA (US); Victor Kai Liu, Mountain View, CA (US); Brandon Michael-James Born, Sunnyvale, CA (US); Kevin Messer, Mountain View, CA (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 18/729,437

(22) PCT Filed: Jan. 20, 2023

(86) PCT No.: PCT/US2023/061015
§ 371 (c)(1),
(2) Date: Jul. 16, 2024

(87) PCT Pub. No.: WO2023/141583
PCT Pub. Date: Jul. 27, 2023

(65) Prior Publication Data
US 2024/0418928 A1    Dec. 19, 2024

Related U.S. Application Data

(60) Provisional application No. 63/301,318, filed on Jan. 20, 2022.

(51) Int. Cl.
*F21V 8/00*        (2006.01)
*G03F 7/00*        (2006.01)

(52) U.S. Cl.
CPC ......... *G02B 6/0065* (2013.01); *G02B 6/0016* (2013.01); *G03F 7/0002* (2013.01); *G03F 7/0007* (2013.01)

(58) Field of Classification Search
CPC ... G02B 6/0065; G02B 6/0016; G03F 7/0002; G03F 7/0007
(Continued)

(56) References Cited

U.S. PATENT DOCUMENTS

2007/0139628 A1    6/2007  Nagasaka et al.
2007/0228589 A1   10/2007  Choi et al.
(Continued)

OTHER PUBLICATIONS

International Search Report and Written Opinion in International Appln. No. PCT/US2023/061015, mailed Jul. 24, 2023, 19 pages.

*Primary Examiner* — Caleen O Sullivan
(74) *Attorney, Agent, or Firm* — Fish & Richardson P.C.

(57) ABSTRACT

The disclosure describes an improved drop-on-demand, controlled volume technique for dispensing resist onto a substrate, which is then imprinted to create a patterned optical device suitable for use in optical applications such as augmented reality and/or mixed reality systems. The technique enables the dispensation of drops of resist at precise locations on the substrate, with precisely controlled drop volume corresponding to an imprint template having different zones associated with different total resist volumes. Controlled drop size and placement also provides for substantially less variation in residual layer thickness across the surface of the substrate after imprinting, compared to previously available techniques. The technique employs resist having a refractive index closer to that of the substrate index, reducing optical artifacts in the device. To ensure reliable dispensing of the higher index and higher viscosity resist in smaller drop sizes, the dispensing system can continuously circulate the resist.

11 Claims, 9 Drawing Sheets

(58) Field of Classification Search
USPC .......................................................... 430/321
See application file for complete search history.

(56) References Cited

U.S. PATENT DOCUMENTS

| | | |
|---|---|---|
| 2018/0299772 A1 | 10/2018 | Jung |
| 2019/0086793 A1* | 3/2019 | Lyons .................. G03F 7/0002 |
| 2020/0341371 A1 | 10/2020 | Iwasaki et al. |
| 2022/0365426 A1* | 11/2022 | Lyons .................. G03F 7/0002 |

* cited by examiner

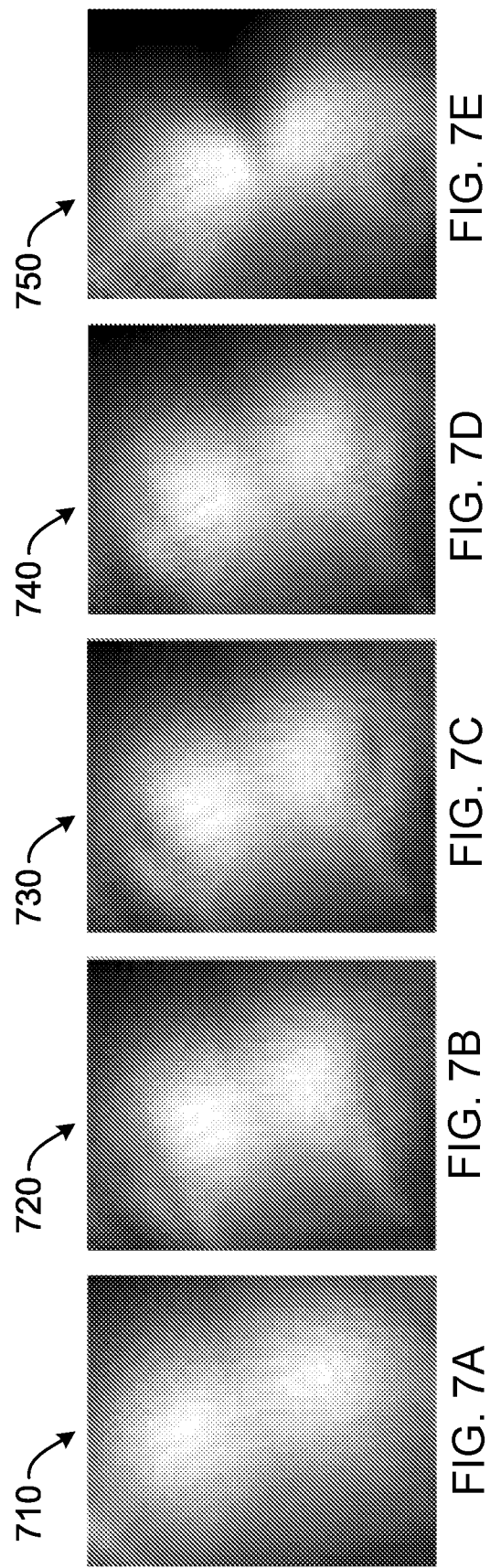

SURFACE RELIEF WAVEGUIDES WITH HIGH REFRACTIVE INDEX RESIST

CROSS-REFERENCE TO RELATED APPLICATION

This application is a National Stage Application under 35 U.S.C. § 371 and claims the benefit of International Application No. PCT/US2023/061015, filed on Jan. 20, 2023, which claims the benefit of U.S. Patent Application No. 63/301,318, entitled "SURFACE RELIEF WAVEGUIDES WITH HIGH REFRACTIVE INDEX RESIST" and filed on Jan. 20, 2022, each of which is incorporated by reference herein in its entirety.

TECHNICAL FIELD

The implementations described herein generally relate to systems and methods for fabrication of surface relief waveguides for eyepieces using fluids with high refractive index, and to the optical devices created thereby.

BACKGROUND

Traditionally, the application of resist for nanoimprint replication of waveguides or other optical elements is through spin coating a solvent-diluted material over a substrate, which results in a flat, uniform layer over the entire substrate. One advantage of this approach for optical applications is local uniformity of the material, which can reduce scattering or phase changes of incident light due to local roughness or height variation. However, replication in manufacturing using spin coating can also result in varying residual layer thickness. In particular, step changes in residual layer thickness from one feature set to another can introduce undesired optical artifacts, and a larger residual layer thickness under smaller features can result in reduced image uniformity, for example when the optical elements are for use in eyepieces in augmented reality and/or mixed reality systems.

SUMMARY

This disclosure describes methods and systems for reliable fabrication of high-quality surface relief waveguides for eyepieces. Optical features in the surface relief waveguides have high nanofeature fidelity and high uniformity in residual layer thicknesses in areas that may have different requirements for resist volume. Innovative aspects described in this disclosure include: i) use of high refractive index nanoimprintable resist with room temperature viscosity and surface tension that allow controlled volume dispensing of the resist; ii) continuous recirculation of the high refractive index nanoimprintable fluid in the dispensing apparatus to maintain reliable dispensing of the resist through narrow fluid channels and nozzles; and iii) sub-2 picoliter (pL) drop-on-demand dispensing of the high refractive index nanoimprintable resist to provide thin, uniform layers with thicknesses that can be closely matched to an imprint template with different zones associated with different total resist volumes on a substrate surface. In some implementations, the substrate can be composed of an inorganic amorphous material (e.g., dense tantalum flint glass TADF55, quartz, etc.), a crystalline material (e.g., $LiNbO_3$, $LiTaO_3$, SiC, etc.), high index polymers (e.g., containing sulfur, aromatic groups, etc.), and/or other polymer materials such as polycarbonate (PC), polyethylene terephthalate (PET), and so forth.

Implementations include a system for manufacturing an optical device, the system including: a reservoir configured to store resist; a fluid dispenser that includes a dispensing mechanism configured to dispense drops of the resist onto a substrate; a meniscus pump configured to cause movement of the resist from the reservoir to the fluid dispenser through a first channel; a fluid pump configured to cause movement of undispensed resist from the fluid dispenser to the reservoir through a second channel; a fluid control device that is communicatively coupled to the fluid pump and the meniscus pump, the fluid control device configured to control the operation of the fluid pump and the meniscus pump to maintain a continuous flow of the resist between the reservoir and the fluid dispenser; and an imprint mechanism that operates to create the optical device by applying an imprint template to the resist that has been dispensed onto the substrate, wherein applying the imprint template creates a pattern of one or more structures in the resist, and wherein the pattern corresponds to the imprint template.

In some implementations, the system further includes a control module that is communicatively coupled to the fluid control device, the fluid dispenser, and the imprint mechanism. The control module can be programmed to send signals that control operations of the fluid control device, the fluid dispenser, and the imprint mechanism.

In some implementations, the drops of the resist have a volume that is less than 6 picoliters, less than 4 picoliters, or less than 2 picoliters.

In some implementations, the resist has a refractive index greater than 1.5 or 1.6 for light with a wavelength of 532 nanometers. In some implementations, the substrate has a refractive index in a range of 1.5 to 2.7.

In some implementations, the imprint template includes at least two zones having structures of different heights.

Implementations also include a method for manufacturing an optical device, the method comprising: operating a fluid dispenser that includes a dispensing mechanism to dispense drops of resist onto a substrate; operating a meniscus pump to cause movement of the resist from a reservoir to the fluid dispenser through a first channel; operating a fluid pump to cause movement of undispensed resist from the fluid dispenser to the reservoir through a second channel, wherein the fluid pump and the meniscus pump operate to maintain a continuous flow of the resist between the reservoir and the fluid dispenser; and operating an imprint mechanism to create the optical device by applying an imprint template to the resist that has been dispensed onto the substrate, wherein applying the imprint template creates a pattern of one or more structures in the resist, and the pattern corresponds to the imprint template.

In some implementations, the method further includes etching at least a portion of the optical device to reduce a residual layer thickness (RLT) of the resist on the substrate, wherein the etching includes one or more of an application of heat or an atmospheric etching.

In some implementations, the etching further reduces a dimension of at least one structure of the pattern created by applying the imprint template.

Implementations also include a waveguide comprising: a substrate; and a plurality of structures imprinted into a volume of resist that dispensed onto the substrate, wherein the resist is composed of a polymer, wherein the resist has an index of refraction in a range of 1.5 to 2.1, and wherein a RLT of the resist in at least one portion of the substrate is in a range of 0 nm to 50 nm.

In some implementations, the RLT of the resist in at least one portion of the substrate is in a range of 0 nm to 10 nm, 40 nm to 50 nm, 30 nm to 40 nm, 20 nm to 30 nm, or 10 nm to 20 nm. In some implementations, the RLT of the resist in at least one portion of the substrate is in a range of 0 nm to 40 nm, 0 nm to 30 nm, 0 nm to 20 nm, or 0 nm to 10. In some implementations, the RLT of the resist in at least one portion of the substrate is in a range of 10 nm to 40 nm or 10 nm to 30 nm. In some implementations, the RLT of the resist in at least one portion of the substrate is in a range of 20 nm to 40 nm.

In some implementations, the plurality of structures provide one or more optically active zones that include one or more of an input coupler, a combined pupil expander, an exit pupil expander, an orthogonal pupil expander, a recycler, or an anti-reflective feature.

In some implementations, the plurality of structures are imprinted with a nanogeometry that includes one or more of a binary geometry, a slanted geometry, a blazed geometry, a sawtooth geometry, a multi-step geometry, a meta feature geometry, a one-dimensional geometry, a two-dimensional geometry, or a three-dimensional geometry.

In some implementations, the substrate has an index of refraction in a range of 1.5 to 2.7.

In some implementations, the plurality of structures are imprinted onto a single side of the substrate. In some implementations, the plurality of structures are imprinted onto two sides of the substrate.

In some embodiments, sub-2 pL dispensing can be achieved by gravity, without the use of pumps (e.g., without a meniscus pump, a fluid pump, or both). One embodiment includes dispensing drops of a resist on a substrate, contacting the resist with an imprint template to yield a pattern of one or more structures in the resist, wherein the pattern corresponds to the imprint template, polymerizing the resist to yield imprinted nanostructures, and separating the imprint template from the imprinted nanostructures. The resist has an index of refraction in a range of 1.5 to 2.1, a residual layer thickness (RLT) of the resist in at least one portion of the substrate is in a range of 0 nm to 50 nm, and the substrate is composed of an inorganic material.

Implementations of this embodiment can have one or more of the following features.

In some implementations, a volume of each drop of the resist is less than 6 picoliters, less than 5 picoliters, less than 4 picoliters. 3 picoliters, or less than 2 picoliters. In some implementations, a volume of each drop of the resist is less than 1 picoliter.

In some implementations, the RLT of the resist in at least one portion of the substrate is in a range of 0 to 10 nm, 10 to 20 nm, 20 to 30 nm, 30 to 40 nm, or 40 to 50 nm. In some implementations, the RLT of the resist in at least one portion of the substrate is in a range of 0 to 40 nm, 0 to 30 nm, 0 to 20 nm, or 0 to 10 nm. In some implementations, the RLT of the resist in at least one portion of the substrate is in a range of 10 to 40 nm or 10 to 30 nm. In some implementations, the RLT of the resist in at least one portion of the substrate is in a range of 20 to 40 nm.

In some implementations, the substrate comprises glass, $LiTaO_3$, $LiNbO_3$, SiC, or a combination thereof.

In some implementations, the resist is free of inorganic nanoparticles. In this case, the resist has an index of refraction typically in a range of 1.5 to 1.8.

In some implementations, the resist comprises inorganic nanoparticles (e.g., $TiO_2$, $ZrO_2$, or both). An average diameter of the inorganic nanoparticles is typically in a range of 5 nm to 15 nm. The inorganic nanoparticles can make up about 10 vol % to about 60 vol % of the resist. The resist typically has an index of refraction in a range of 1.5 to 2.1.

In some implementations, a viscosity of the resist is in a range of 5-25 centiPoise (cP) at 25° C.

In some implementations, a surface tension of the resist is in a range of 20-60 milliNewton (mN) per meter (m) at 25° C.

In some implementations, dispensing the drops of the resist comprises pumping the resist from a reservoir to a fluid dispenser through a first channel. Some implementations include maintaining a continuous flow of the resist between the reservoir and the fluid dispenser. In some implementations, maintaining the continuous flow of the resist between the reservoir and the fluid dispenser includes pumping undispensed resist from the fluid dispenser to the reservoir through a second channel.

In some implementations, dispensing the drops occurs without pumping of the resist (e.g., without pumping the resist with a meniscus pump, a fluid pump, or both).

Other features and advantages of the present application will be apparent from the following detailed description and figures, and from the claims.

BRIEF DESCRIPTION OF THE DRAWINGS

FIGS. 7A-7E shows images of simulation test results for waveguides manufactured using various techniques.

DETAILED DESCRIPTION

Figure 1:
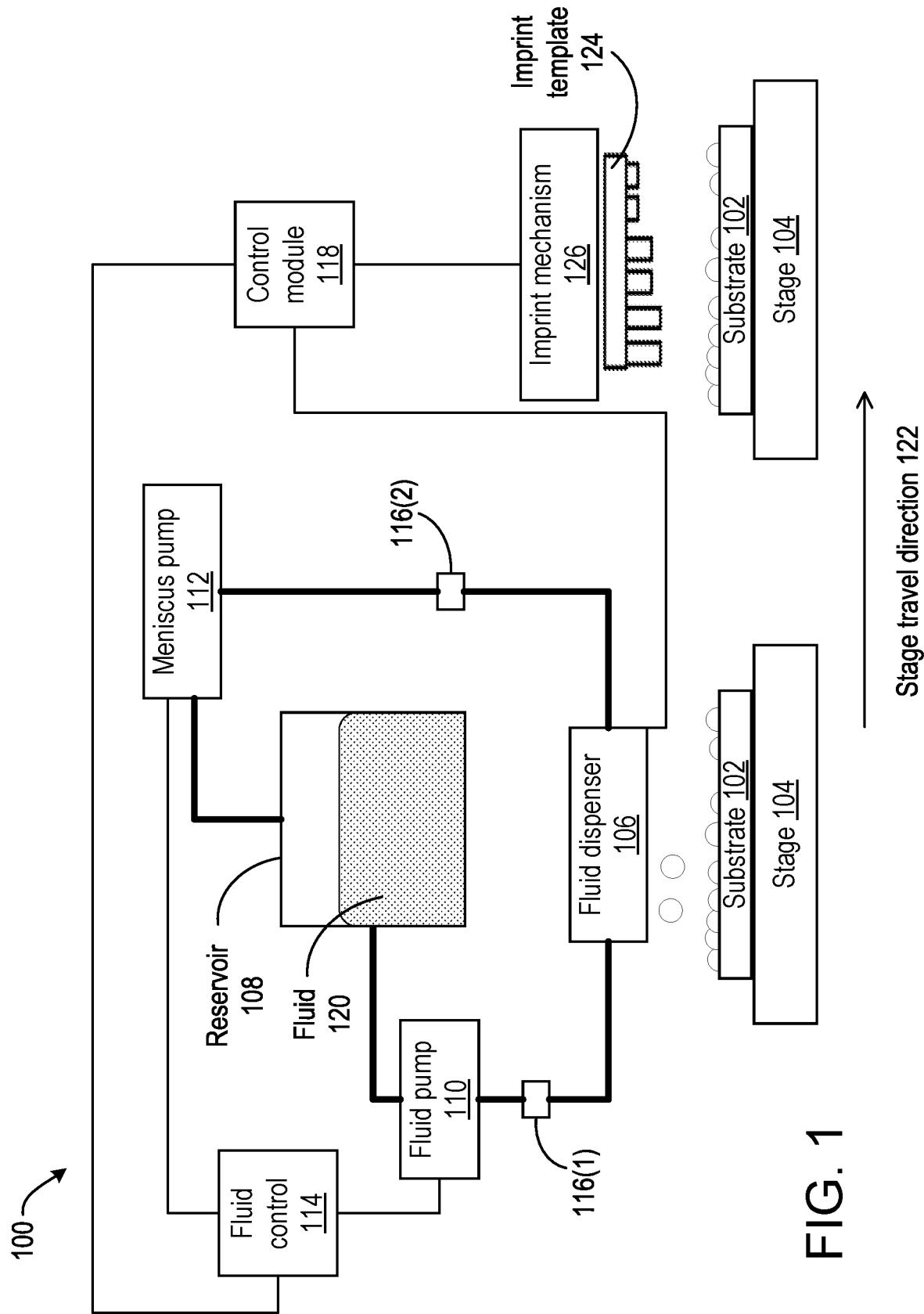
FIG. 1 depicts an example system for fluid dispensing and imprinting, according to implementations of the present disclosure.

Implementations described herein provide a drop-on-demand, controlled volume dispensing technique for dispensing a fluid onto a substrate with precise control of the volume of the droplets being dispensed, and the location on the substrate onto which they are dispensed. The dispensed fluid can then be imprinted to create a patterned optical device suitable for use in augmented reality (AR) and/or mixed reality (MR) systems, and/or other suitable optical applications. The innovative technique described herein enables the dispensation of drops of the dispensed fluid (which may also be described as a resist, photoresist, or resin) that are of a smaller size than the drop size used in previously available drop-on-demand inkjetting techniques. In particular, implementations employ drop sizes of less than two picoliters (pL), which provides for dispensation of thin, uniform layers of resist with target volumes that can be matched to an imprint template having different zones associated with different total resist volumes suitable to fill the template. Use of smaller drop size also provides for substantially less variation in the interconnecting residual layer thickness (RLT) across the surface of the substrate, compared to previously available techniques that employ larger drop size. Further, the techniques described herein employ dispensed resist having a high refractive index that may more closely match the index of the substrate, thus reducing optical artifacts in the manufactured optical device. A resist with high refractive index may also have higher viscosity than that used in previously available techniques. Accordingly, to ensure reliable dispensing of a higher viscosity resist in smaller drop sizes, implementations employ a resist dispensing system that provides for the substantially continuous recirculation of the resist fluid. Such recirculation enables the system to operate with the fluid at room temperature viscosity and surface tension, while maintaining reliable dispensing through narrow fluid channels and nozzles, thus facilitating high throughput manufacturing of high quality optical devices.

High refractive index materials are typically used as substrate materials for surface-relief based diffractive waveguides in AR and/or MR systems. The use of a high index substrate helps support a wide field of view of the virtual image, which can couple into the waveguide(s) and exit the waveguide(s) toward a user's eye. However, surface relief diffractive features are typically composed of materials with a lower refractive index than the substrate (e.g., a refractive index of less than 1.6). When used as optical combiners in an AR/MR system, this refractive index mismatch can lead to undesirable optical artifacts and limit the image brightness and overall uniformity, including the user-to-world ratio of image brightness. In one example, for a single side design with surface features on one side of a substrate, the user-to-world ratio can increase from 1:1 to 1.25:1 for an increase in resist index of 1.53 to 1.65. The use of a higher index resist, as provided by the implementations described herein, allows for the use of gratings having higher diffraction efficiency compared to similar gratings with the same nanogeometry, thus allowing for a higher value of image brightness and uniformity over the desired eye box position or range.

Larger RLT and/or variations in RLT uniformity, such as those produced using traditional techniques, can also lead to optical artifacts. Accordingly, the implementations described herein also provide for higher quality optical devices by enabling the use of smaller resist drop sizes during dispensation of the resist, leading to less variation in RLT uniformity overall and less variation (if desired) between zones having different feature heights. The implementations described herein provide for a system and method of manufacturing high-quality optical devices, allowing the use of high-index resist materials that minimize the difference between the refractive indexes of the resist and the substrate, thus reducing the undesirable effects resulting from the difference in refractive index. Implementations also provide for the fabrication of devices having a thin and/or uniform RLT that satisfies the cost and throughput considerations for high-volume manufacturing of optical devices.

As used herein, optically transparent generally refers to the physical property of allowing light to pass through a material without being scattered or absorbed. As used herein, a high refractive index generally refers to a refractive index (n) (e.g., of the imprinted polymer resist) that greater than 1.5, or greater than 1.6 or 1.7. In one example, a high refractive index refers to n greater than 1.6 or 1.7 and less than 1.9. In one example, a high refractive index refers to n in a range of 1.5 to 1.8.

As used herein, total thickness variation (TTV) refers to the difference between the maximum and minimum values of the thickness of a substrate in a series of point measurements across a dimension of a substrate. For a substrate having a patterned surface, the TTV refers to an approximation assessed by ignoring contributions of pattern features to the thickness. For example, a thickness (or height) of a typical feature on a patterned substrate may be in a range of approximately 10 nanometers (nm) to 150 nm. That thickness is governed at least in part by the trench depth of the template, which can vary by 10% (e.g., 1 nm to 15 nm). The TTV of an unpatterned substrate typically exceeds 100 nm, and is sometimes on the order of microns. Thus, the additional variation in thickness of a patterned substrate introduced by the pattern features is negligible, and can be ignored as an approximation. Accordingly, the thickness of a patterned substrate assessed at a location that includes a protrusion can be approximated by subtracting a given feature thickness from the assessed thickness to yield an adjusted thickness, while thickness of a patterned substrate assessed at a location without a protrusion is unchanged. That is, the adjusted (e.g., reduced) thickness of a feature area and a native thickness of an unpatterned area can be used to calculate TTV for a substrate having a patterned surface. The low TTV values described herein result at least in part from flat optical grade glass substrates, polished to meet a desired flatness, as well as methods described herein to minimize or reduce uneven material shrinkage during curing. The low TTV can also be imparted to an inorganic material substrate through extrusion. The low TTV can also be imparted to a polymer substrate material and achieved from mold surfaces while molding (e.g., injection molding, ultraviolet (UV) or thermal molding, extrusion, etc.) such substrates from base materials consisting of high index polymers (e.g., containing sulfur, aromatic groups, etc.) and other polymer materials such as polycarbonate (PC), polyethylene terephthalate (PET), and the like.

FIG. 1 is a system diagram illustrating an example system 100 for dispensing fluid (e.g., high refractive index nanoimprint resist) onto a substrate, and imprinting the dispensed fluid to create a pattern on the substrate.

As shown in FIG. 1, the system 100 can include a substrate 102 supported by a stage 104. The substrate 102 may be composed of any suitable material such as glass or polymer. The stage 104 may be configured to support the substrate 102 and stabilize the substrate 102 during fluid dispensing, imprinting, curing, etching, and/or other manufacturing operations. A fluid dispenser 106 is configured to dispense drops (or droplets) of a fluid 120, such as resist, onto the substrate 102. The fluid dispenser 106 may also be described as one or more printheads. The fluid 120 is held in a reservoir 108, which is connected to the fluid dispenser 106 by one or more channels (e.g., tubes, conduits, etc.) of suitable type, material, and dimension. A fluid pump 110 operates to circulate the fluid 120 between the reservoir 108 and the fluid dispenser 106. A meniscus pump 112 operates to extracts droplets of the fluid 120 from the reservoir 108, from which the fluid 120 flows to the fluid dispenser 106.

A fluid control 114 is communicatively coupled to the pumps 110 and 112, and sends signals to pumps 110 and 112 to control their operation and maintain continuous circulating flow of the fluid 120 within the system. As discussed herein, the continuous circulating flow of the fluid 120 enables reliable dispensation of the high refractive index, high viscosity fluid in droplets that are smaller in size compared to traditional techniques. The system 100 can include one or more pressure sensors 116 that measure the pressure of the fluid 120 as it circulates within the system. Although FIG. 1 depicts an example that uses two pressure sensors 116(1) and 116(2), the system can include any suitable number and type of the pressure sensor(s) 116, at any suitable location(s) in the system. The fluid control 114 is communicatively coupled to the pressure sensor(s) 116 and can receive, from the pressure sensor(s) 116, pressure data describing the pressure of the fluid 120 at one or more locations in the system. The fluid control 114 can use the pressure data to control the circulating flow of the fluid 120 in the system and ensure substantially continuous circulating (e.g., recirculating) flow.

In the system 100, fluid recirculation can be maintained through the printhead(s) by the combination of a diaphragm-based fluid pump that supplies fluid to the inlet of the printhead at positive pressure and a meniscus vacuum pump the applies negative pressure to the outlet of the printhead(s). Alternatively, a second diaphragm-based fluid pump can be used to apply negative pressure to the outlet. By applying appropriate inlet and outlet pressures, the meniscus pressure at the printhead nozzles and the differential pressure through the head are independently controlled. The meniscus pressure set-point is chosen to prevent both dripping of fluid from the nozzles of the printhead(s) and the ingestion of air through the nozzles into the printhead(s). The pressure can be set at a value in a range between −10 to −40 mbar. The differential pressure is proportional to the flow rate of resist through the printhead and is set to deliver flow rates of between approximately 50-150 milliliters (mL)/minute.

To ensure system reliability, the various hardware elements of the system can be designed with consideration for the composition of the particular resist that is to circulate within the system. The composition of system components interacting with the resist can be critical, as some weaker polymer components can, over time, start chemically dissolving and mixing with the resist fluid. Thus, more chemically resistant parts (e.g., made of polytetrafluoroethylene (PTFE), nylon, etc.) can be used to ensure reliable functioning of the printhead system, including the components involved in fluid recirculation.

A control module 118 is communicatively coupled to the fluid control 114 and the fluid dispenser 106 to control their operations. In some implementations, the control module 118 is a computing device that includes at least one processor and memory. The memory can store a computer program that includes instructions which, when executed by the at least one processor, cause the processor(s) to perform operations to control the fluid control 114, the fluid dispenser 106, and/or other components of the system. The control module 118 may be any suitable type of computing device, such as a personal computer, and may communicate with other computing devices to receive instructions, provide data, etc.

In some implementations, the system 100 includes a mechanism (not shown) that moves the stage 104 and the substrate 102 along a stage travel direction 122 between multiple phases of a process to manufacture the optical device. This mechanism may also be controlled by the control module 118. The stage 104 (and substrate 102) can be moved from a first position at which the fluid 120 is dispensed onto the substrate 102 during a first phase of a manufacturing process, to a second position. At the second position, the substrate 102 is imprinted during a second phase using an imprint template 124 that forms the fluid 120 into a desired pattern to create the optical device. The imprint template 124 can be operated by an imprint mechanism 126 that is controllable by the control module 118. During one of the phases, or in a separate phase, the fluid 120 may also be cured using light (e.g., UV light), heat, and or a combination of light and heat. Alternatively, the system can be configured such that the dispensing, imprinting, and/or curing of the fluid 120 are performed at a same position of the stage 104.

Although FIG. 1 shows an example of a system 100 that includes a single fluid dispenser 106, other implementations are possible. The system may be a single fluid circulation system that includes multiple fluid dispensers to dispense resist, in parallel to different substrates and/or different portions of a substrate, to enable more efficient and higher capacity manufacturing. Moreover, the system may include multiple fluid circulation systems to circulate different resist fluids (e.g., having different indexes of refraction) and dispense the different resists through different printheads to different regions of a substrate. For example, a first resist having a first index of refraction may be dispensed to a combined pupil expander (CPE) region of the substrate, while a second resist having a second index of refraction may be dispensed (e.g., in parallel with the first resist) to a different region such as the in-coupling grating (ICG) or recycler. Accordingly, the manufacturing may include a single dispense and imprint step that dispenses and imprints multiple resists in different regions. Alternatively, the multiple systems may circulate and dispense the same fluid to achieve higher throughput in the manufacturing process.

Figure 3:
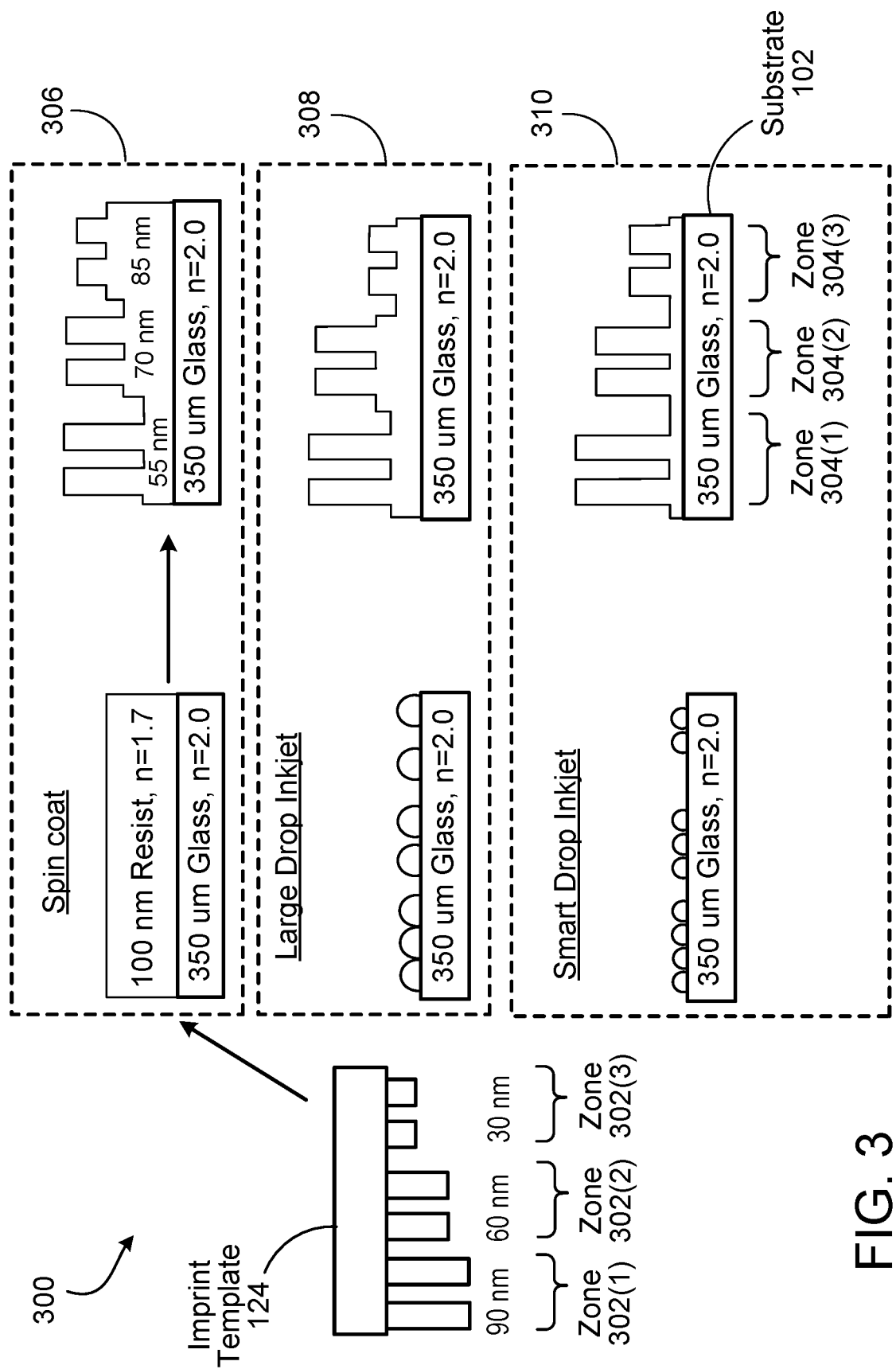
FIG. 3 depicts example results of different imprinting processes.

Traditional systems employ spin coating techniques to apply resist to a substrate. In such systems, application of resist for nanoimprint replication of a waveguide or other optical elements is accomplished by spin coating a solvent-diluted material over a substrate, resulting in a uniform, flat layer over the entire substrate. This traditional approach provides advantages in that it is an industrially mature process, and it provides excellent local uniformity of the dispensed material. Such uniformity minimizes scattering or phase changes of incident light due to local roughness or height variation. However, there are also drawbacks for replicating in manufacturing using traditional spin coating techniques. If the goal is to create target features that are non-uniform (e.g., of varying height and/or duty cycle), the amount of resist required to fill the template features during the nanoimprint process varies. Because the underlying applied film starts off as substantially uniformly distributed, spin coating can lead to a final film (e.g., after template imprinting) with a varying RLT, as illustrated in FIG. 3. Large step changes in the RLT when moving from one feature set to another introduce undesired optical artifacts. Larger RLTs under smaller features result in reduced image uniformity especially on the temple side. Another manufacturing drawback of spin coating is that more than 95% of the resist solution is wasted, thus significantly increasing the manufacturing cost.

Rather than spin coating, implementations employ a modified version of a drop-on-demand Jet and Flash Imprint Lithography (J-FIL) process to apply resist for nanoimprint. The J-FIL process locally adapts the amount of fluid to the amount that is appropriate to fill features, thus reducing large step changes in RLT from one feature zone to another compared to the step changes that result of spin coating. The traditional J-FIL process uses large drops (e.g., >3 pL) of the dispensed material with indices greater than 1.6, and is produced by standard industrial printheads. However, the traditional J-FIL process also has disadvantages. Using this process, the drops of resist do not spread to form a uniform local film, so there is some local non-uniformity in the imprint fluid thickness introduced where drops merge. Additionally, due to the digital nature of the dispensing process of traditional J-FIL, not all target thicknesses or boundaries can be perfectly matched.

The implementations described herein provide for a system and process that is a modification of the traditional J-FIL technique, and that addresses the problems of the traditional J-FIL technique. Implementations employ smaller (e.g., <2 pL) drops of high-index resist with higher resolution to improve local flatness and further reduce step height changes in RLT within a zone of similar nanofeatures (also described as features, structures, or nanostructures), as well as across transitions between two or more feature zones in the imprinted pattern. In other words, implementations employ smaller drops of high-index resist to improve both local surface flatness (RLTu) and reduce the magnitude of RLT step changes at boundaries and/or zone transition regions.

To achieve a sub-2 pL nanoimprint with a high-index resist, the technique described herein employs a combination of the following: 1) high refractive index (e.g., n>1.6) fluids with rheological properties compatible with the controlled volume dispensing process; 2) fluid recirculation to maintain reliable jetting in the printheads of the fluid dispenser 106 (e.g., printhead) dispensing the resist; and 3) a multi-nozzle fluid dispenser 106 that is capable of generating sub-2 pL drops of resist and delivering them with sufficient precision to the substrate to provide nanoimprint optics with minimal defects.

To be dispensable by an inkjet-type dispensing process, a material typically must have a viscosity in a range of 5-25 centiPoise (cP) and a surface tension in a range of 20-60 (e.g., 20-40) milliNewton (mN) per meter (m). Many high refractive index components, either organic or inorganic, have properties that are out of that range. In traditional inkjet applications, heating is used to lower the viscosity of a more viscous material to a jettable range of viscosity. However, heating poses risks of both oxidation and gelation and is generally undesirable in a reactive material designed to be UV-cured. Implementations therefore employ high refractive index resists, which provide a higher refractive index than competing commercial materials while having rheological properties that allow inkjet-type dispensing at room temperature.

Implementations support the use of various suitable types of high refractive index resist. In some implementations, the resist (e.g., fluid 120) is a polymer-based resin with incorporated nanoparticles (NPs) of a higher index material. Alternatively, the resist can be a polymer-based resin without incorporated NPs. Incorporation of NPs may increase the overall refractive index of the material, which provides advantages in more closely matching the refractive index of the substrate as described herein. However, incorporation of NPs may also cause Rayleigh scattering of light in the resist. Accordingly, the choice of using a resist that includes NPs, or that omits NPs, may be based on a balancing of considerations, e.g., higher index vs. more scattering. For example, a resist with refractive index 1.6 or 1.7, and without NPs, may provide optimal performance that provides for a higher index (e.g., closer to that of the substrate) while avoiding the scattering that would be caused by the presence of NPs.

Organic (meth)acrylate monomers and oligomers typically have a refractive index of approximately 1.5 at a 532 nm wavelength. Sulfur atoms and aromatic groups, which both have higher polarizability, can be incorporated into these acrylate components to increase the refractive index of the formulation. This effect can be limited due to the fluid viscosity restriction of less than 20-25 cP for the inkjet process, and by the refractive index upper limit of the sulfur containing molecules. This approach yields jettable and imprintable resists with a refractive index as high as 1.72 at 532 nm wavelengths of light.

Incorporating inorganic nanoparticles (NP) such as $ZrO_2$ and $TiO_2$ can increase refractive index significantly further. Pure $ZrO_2$ and $TiO_2$ crystals can reach a refractive index of 2.2 and 2.4-2.6, respectively, at 532 nm. For the preparation of optical nanocomposites of acrylate monomer and inorganic nanoparticle, the particle size is smaller than 10 nm to avoid excessive Rayleigh scattering. Due to its high specific surface area, high polarity, and incompatibility with the cross-linked polymer matrix, a $ZrO_2$ NP has a tendency to agglomerate in the polymer matrix. Surface modification of NPs can be used to overcome this problem. In this technique, the hydrophilic surface of $ZrO_2$ is modified to be compatible with organics, thus enabling the NP to be uniformly mixed with the polymer. Such modification can be done with silane and carboxylic acid containing capping agents. One end of the capping agent is bonded to $ZrO_2$ surface; the other end of capping agent either contains a functional group that can participate in acrylate crosslinking or a non-functional organic moiety. Examples of surface modified sub-10 nm $ZrO_2$ particles are those supplied by Pixelligent Technologies™ and Cerion Advanced Materials™. These functionalized nanoparticles are typically sold uniformly suspended in solvent as uniform blends, which can be combined with other base materials to yield resist formulations with jettable viscosity and increased refractive index.

The higher surface tension of some high-index components can pose an implementation challenge for inkjet-based nanoimprint lithography (NIL) processes. High surface tension tends to support the formation of bubbles in fluids. Formation of bubbles and subsequent air blockages of nozzles and fluid channels is a common reliability problem for inkjet processes. As channel and nozzle size shrink to support the formation of smaller drops, such as those used in the techniques described herein, this problem becomes more severe. Accordingly, the implementations described herein provide systems and methods that include continuous circulation of the resist fluid. Continuous flow of the fluid through the channels in system 100 sweeps bubbles away from the narrow channels and maintains a steady supply of fluid.

This approach is also compatible with the incorporation of resist solutions containing higher vapor pressure solvents, such as high-index inorganic nanoparticles dispersed in solvent, into resist formulation. Without recirculation, solvent evaporation at the faceplate of the fluid dispenser 106 could cause a buildup in viscosity and nozzle failure. This in turn would have a negative effect on the quality of the imprint, RLTu, and nanofeature fidelity, and would severely affect the image quality of the manufactured eyepiece waveguide, in terms of image sharpness, contrast, uniformity, and efficiency.

The formation and accurate placement of small drops is especially important for the dispensing of high viscosity and higher surface tension fluids. High viscosity and high surface tension negatively impact the NIL process by slowing feature filling and drop pre-spread, respectively. Lower index materials typically spread and fill more easily and are less likely to generate RLT variation. Further, higher index imprinted layers (e.g., n>1.6) are more optically sensitive to RLT variation compared to imprints of a lower index resist (e.g., n=1.53). In the case of resist formulations that contain nanoparticles, long time delays before the drops merge can allow for material phase segregation and undesirable variations in refractive index across the applied resist. Smaller drops with smaller drop interstitial spacing provide a greater benefit when using high refractive index materials, because the smaller drops can be placed more accurately and more densely on the substrate, thus mitigating the problems of slow drop pre-spreading and slow feature filling that may otherwise be present when using high index fluids that exhibit high viscosity and high surface tension. Accordingly, by modifying the traditional J-FIL process through use of high-index materials, smaller drop sizes, and reliable operation through fluid recirculation, implementations allow for the manufacture of high performance optical components. The advantages provided by the implementations described herein are further described with reference to FIG. 3.

Figure 2:
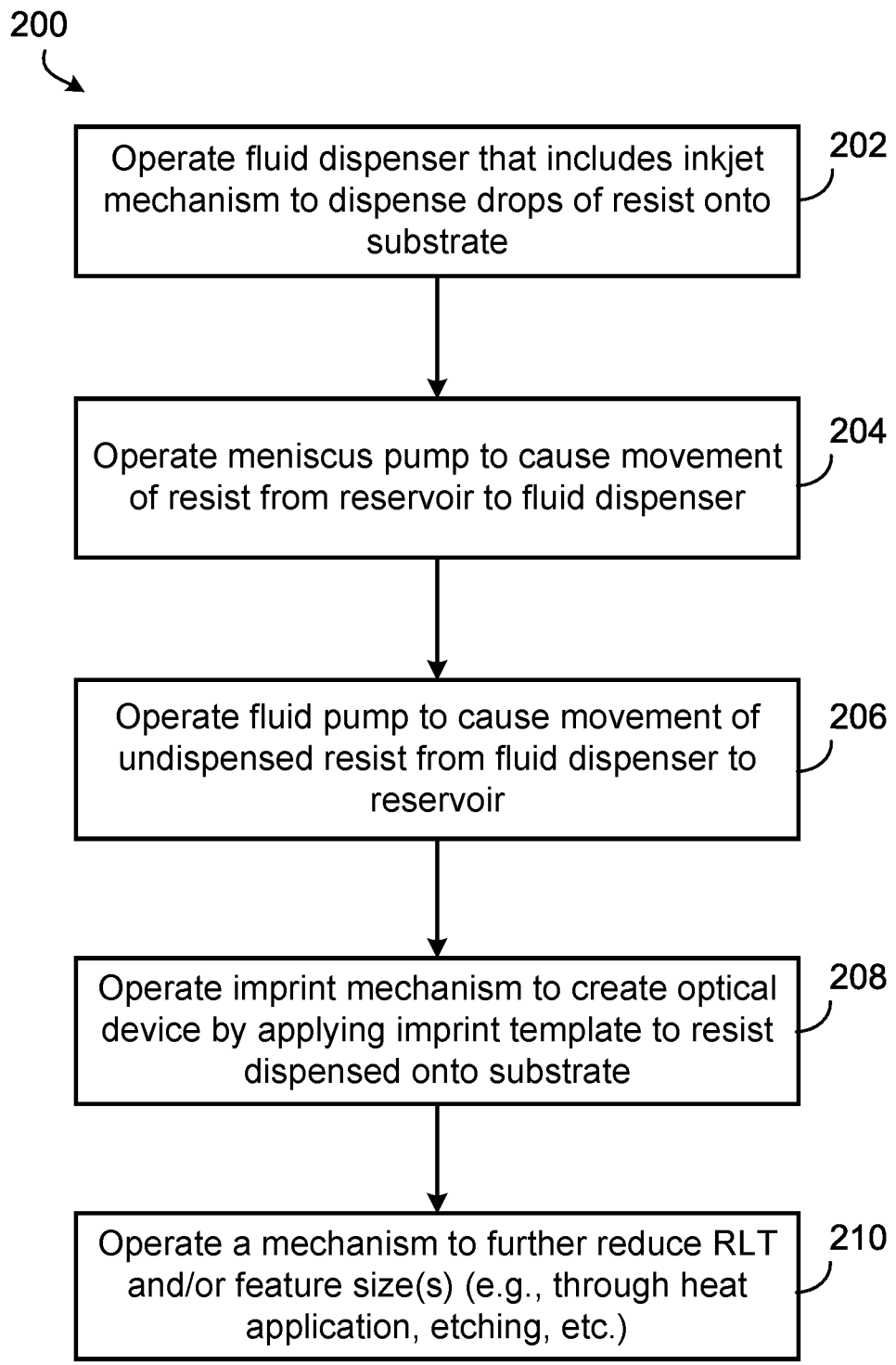
FIG. 2 depicts a flow diagram of an example fabrication process, according to implementations of the present disclosure.

FIG. 2 is a flowchart illustrating an example process 200 for fabrication of an optical device, according to the implementations described herein. In 202, the fluid dispenser is used to dispense drops of resist onto the substrate. As discussed herein, the fluid dispenser (also referred to as a printhead) may be configured to use the controlled volume dispensing mechanism of FIG. 1 to dispense the drops. At 204, the meniscus pump is used to cause the resist to move from the reservoir to the fluid dispenser, through the first channel. At 206, the fluid pump is operated to cause the resist (e.g., the undispensed, excess resist) to move from the fluid dispenser back to the reservoir, through the second channel. At 208, the imprint mechanism is operated to apply the imprint template to the resist on the substrate, to generate the optical device (e.g., the imprinted substrate to be used as a waveguide). The process may also include a step for curing the resist using UV light and/or heat, as described herein.

In some implementations, one or more additional steps may be performed at 210 to further reduce the RLT, to create optical devices (e.g., waveguides) with ultra-thin RLTs. For example, a suitable etching process may be performed to further reduce the RLT. For example, after dispensing of the resist and application of the template (and in some implementations, curing), etching may reduce the RLT from an initial level at or below 50 nm to an RLT in a range of approximately 0-10 nm. Such reduction of the RLT can be done across the surface of the substrate or in a particular region, such as at least a portion of an eye pupil expander (EPE) region of the waveguide. In some examples, the etching may employ a stencil or other type of mask to control what areas are etched to reduce the RLT.

In some implementations, the RLT may be reduced in one or more regions of the substrate through application of heat. For example, an application of heat in the range of 120-200° Celsius (C) may be applied to the substrate and/or imprinted pattern to reduce the RLT. Such heat application may also reduce the size of the imprinted nanofeatures. The applied heat may reduce the RLT and/or nanofeatures by causing heat shrinkage of the cross-linked polymer chains. For example, if a desired nanogeometry includes a feature that is 20 nm in height (e.g., relative to the RLT), then the dispensing and imprinting can be configured to create a feature that is higher and which is then reduced through application of heat to the desired height. Similarly, if the desired final RLT is below 10 nm, an initial RLT of 20 nm can be reduced to the desired RLT through application of heat. Similarly one can start with an imprint of 30 nm and end up with imprints of sub 10 nm and in some cases approaching ~0 nm with post heat treatment.

In some implementations, an atmospheric plasma etch (e.g., using a plasma that is a mixture of Argon and $O_2$) can reduce the RLT as low as 0 nm if desired, to provide substantially free-standing nanostructures on the substrate. Such a solution can be employed in instances where the template may have a predefined biased imprint geometry which accounts for isotropic etch loss of the feature width in removing the RLT. Nano-geometry features can also be reduced smoothly using an atmospheric plasma at relatively low temperatures, such as temperatures below 60° C. The presence of Ar ions and O radicals in the plasma afterglow can physically and/or chemically remove the organic material isotropically. In some implementations, a UV $O_3$ treatment at atmospheric pressure and at temperature below 50° C. can also reduce nanogeometry and the RLT of imprints on such substrates. In this example, the creation of oxygen radicals from $O_3$ in the presence of UV light tends to react and remove the organic material isotropically. In some implementations, reactive ion etching at pressures lower than atmospheric pressure can also be used to achieve a more anisotropic etch in the presence of a mixture of one or more of Ar, $O_2$, $N_2$, He, and $CF_4$.

In some cases, one or more of the operations in process 200 is replaced or combined with another operation, the order of one or more the operations is interchanged, two or more operations occur simultaneously or continuously, or any combination thereof. In certain cases, process 200 may include one or more additional operations as described herein.

FIG. 3 provides a diagram 300 illustrating example results of three different imprinting processes. As described above, an imprint template 124 is applied to the resist (e.g., fluid 120) after the resist has been dispensed onto a substrate 102, to imprint a pattern onto the substrate 102. In this particular example, the template 124 includes three zones 302(1), 302(2), and 302(3) that include features of different heights, 90 nm, 60 nm, and 30 nm, respectively. It should be noted that the particular dimensions and other values shown in FIG. 3 are examples, and implementations are not limited to these examples. The goal of the imprinting process is to use the template 124 to imprint a pattern onto the substrate 102 that most accurately reflects the template 124. In this example, the goal is to create a pattern on the substrate 102 that includes three corresponding zones 304(1), 304(2), and 304(3) with the corresponding height differences, and with minimal RLT variation. The particular template 124 shown in FIG. 3 is an example, and implementations are not so limited.

Implementations can employ any suitable template that imprints any suitable pattern onto the substrate 102. Further, although this example depicts a substrate 102 that is 350 µm glass with a refractive index of 2.0, implementations can employ a substrate of any suitable dimensions and material. For example, the substrate 102 may be composed of a polymer material instead of glass.

FIG. 3 shows three example results 306, 308, and 310, resulting from three different imprinting techniques. In the first example 306, spin coating is used. In this example, a uniform 100 nm spin coated resist is paired with the example template having three different feature height zones, which may be found in a diffractive optical element. Due to the shortcomings of the spin coating technique as described above, this process results in 15 nm step changes in RLT height between the feature zones 304. The second example 308 shows a result using a traditional J-FIL technique. Using this process, the amount of fluid can be varied locally to match the feature requirements, thus reducing but not eliminating the RLT step changes between zones. As described above, the large drop size used in traditional J-FIL still leads to local thickness inconsistencies and thus can lead to variations in RLT between zones.

The third example 310 shows a result using the modified J-FIL technique, according to the implementations described herein. Because implementations enable the use of smaller drops with a tighter pitch, the local fluid density and boundaries can be controlled even more effectively thus greatly mitigating or eliminating variations in RLT between zones, and also enabling a smaller overall RLT, as shown. Tighter pitch corresponds to a reduced size of interstitial gaps between the drops. Use of smaller drop sizes provides an advantage in that the packing density of the drops can be increased while still maintaining the desired total volume of dispensed resist. The smaller and more densely packed drops provide for better RLT uniformity in the nanofeature zones as well as in blank areas without features.

The techniques described herein enable the dispensing and imprinting of high-index resist on a substrate, to provide very low RLT compared to previously available solutions. For example, the implementations described herein can provide for an RLT that is less than 30 nm or even less than 15 nm. This can be achieved because the dispensing mechanism enables the droplets of resist to be dispensed at locations on the substrate where the resist is needed, according to the template being used to do the imprinting. Stated somewhat differently, the mechanism enables more precise spatial and volume control of the placement of the resist on the substrate, such that more resist is placed at locations where the template is creating larger structures that may require the larger volume of resist, e.g., to more optimally fill the template during imprinting. The techniques described herein also enable the imprinting of more complex or more intricate structures compared to those that could be created using previously available methods, because the dispensing mechanism is able to place droplets precisely at locations that that correspond to the structures to be created by the template, compared to traditional (e.g., spin coating) techniques that apply a substantially even layer of fluid across an area of a substrate. This dispensing mechanism provides flexibility for imprinting more complex features to achieve the desired optical effects in the waveguide, as well as providing more control over the particular RLT that may be imparted to different regions of the substrate.

In some examples, the diffractive surface relief imprint is fabricated over a substrate consisting of high index resist polymer, with an ultra-thin RLT that is in a range of 0 nm to 50 nm. In some implementations in which the imprinting is performed to manufacture a waveguide for use in optical devices, such as AR/MR devices, an RLT of 10-20 nm may be used in various portions of the waveguide such as an input coupling zone, a combined pupil expander, an exit pupil, an orthogonal pupil expander, a recycler, anti-reflective features, and so forth. The high index ultra-thin RLT imprint over a waveguide substrate, in every gradation zone in the waveguide eyepiece, can provide a desired gradation of nanofeatures in duty cycle and or feature height.

The high index ultra-thin imprint can be performed over a substrate to create nanogeometry of various configurations. For example, the nanogeometry can include features that are binary (e.g., rectangular), slanted, blazed, sawtooth, multi-step, and/or more complex meta features, etc. The features can include one-dimensional lines and spaces, two-dimensional features (e.g. symmetric pillars or holes), alternating gratings or two-dimensional features at the same of different pitch and/or three-dimensional features (e.g., asymmetric pillars or holes).

Figure 4A:
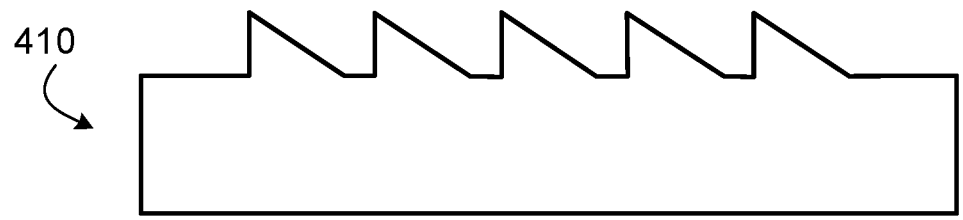
FIGS. 4A-4C depict example imprinted nanostructures, according to implementations of the present disclosure.
Figure 4B:
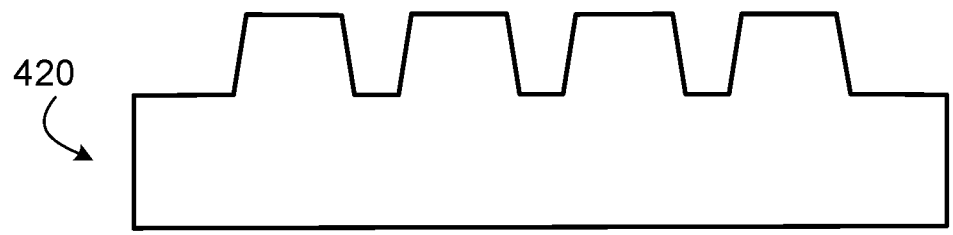
Figure 4C:
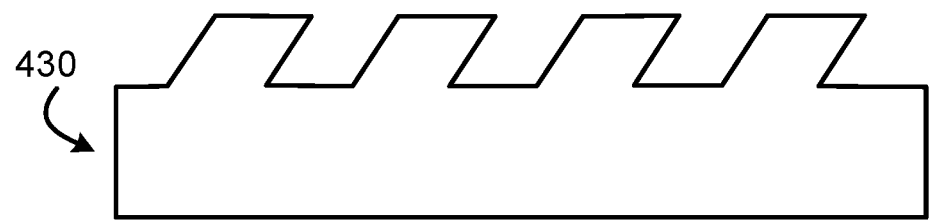
Figure 5A:
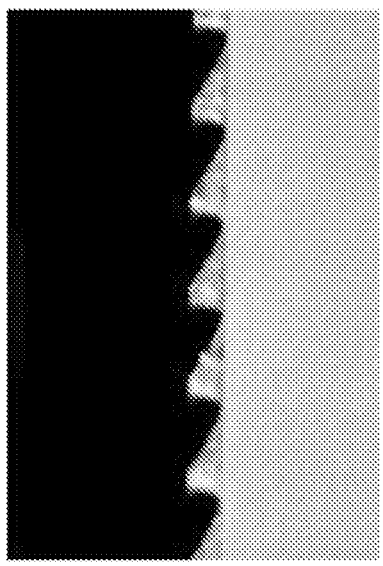
FIGS. 5A-5N show images of various example nanostructure geometries, according to implementations of the present disclosure.
Figure 5D:
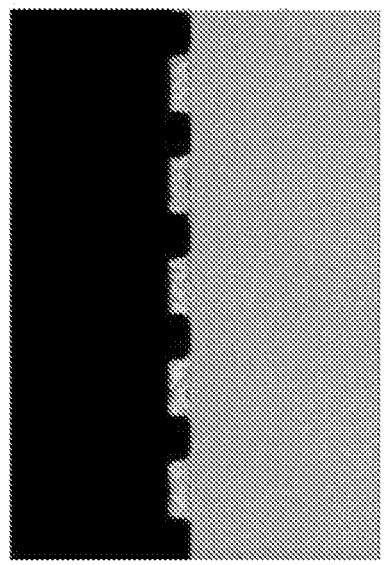
Figure 5B:
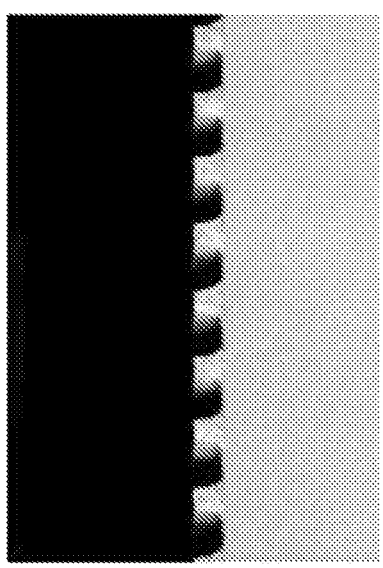
Figure 5E:
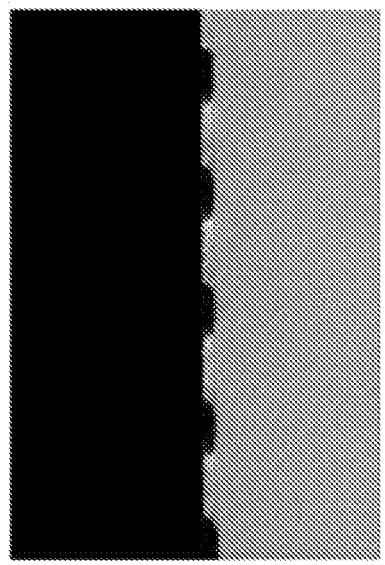
Figure 5C:
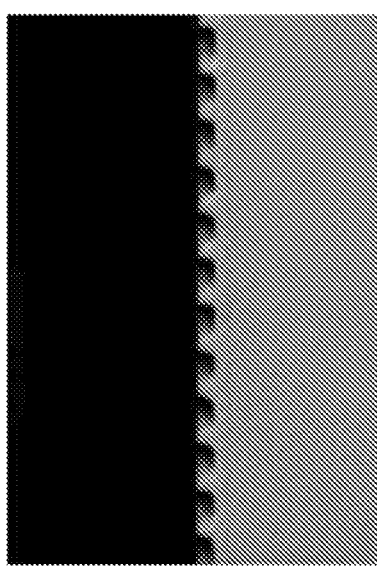
Figure 5F:
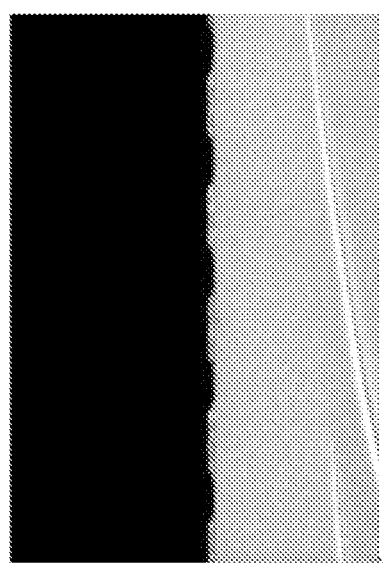
Figure 5G:
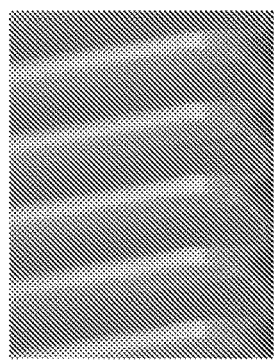
Figure 5H:
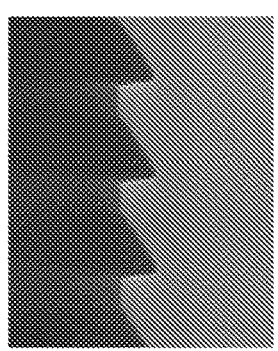
Figure 5I:
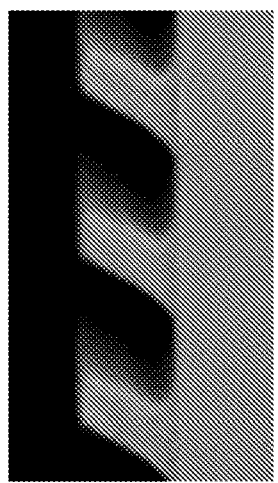
Figure 5J:
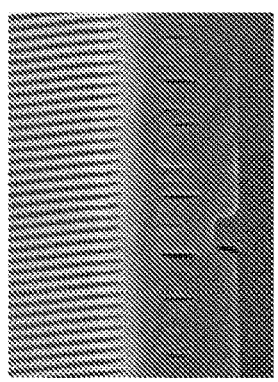
Figure 5K:
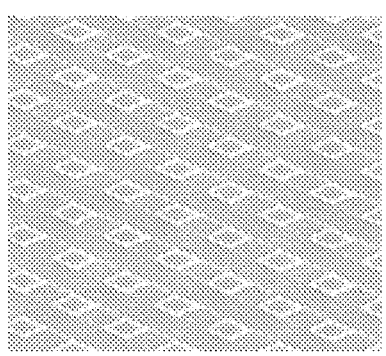
Figure 5L:
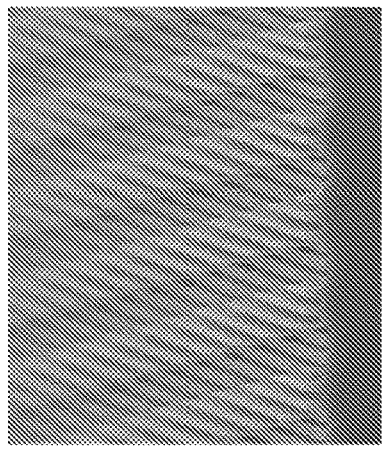
Figure 5M:
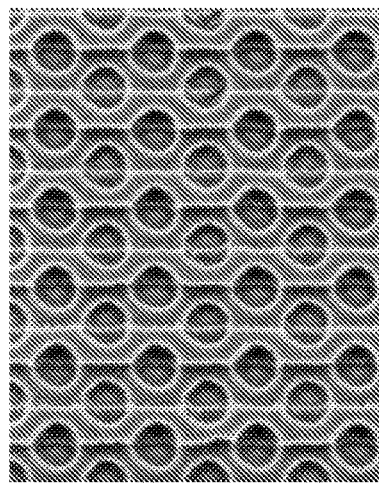
Figure 5N:
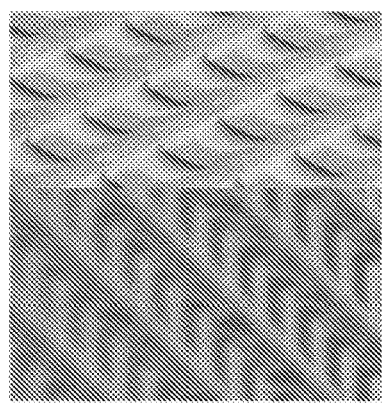

FIGS. 4A-4C depict example imprinted nanostructures, according to implementations of the present disclosure, such as triangular or sawtooth structures 410, trapezoidal structures 420, and rhomboid structures 430, respectively. Other suitable types of nanostructures may also be created. FIGS. 5A-5N show captured images of various geometries created using the techniques described herein. For FIGS. 5A-5F, the scale bar is 100 nm. FIGS. 5A-5E show rectangular gratings of various sizes and spacings. FIG. 5F shows a sawtooth grating. FIG. 5G shows a multi-step grating. FIG. 5H shows a sawtooth grating. FIG. 5I shows a slanted grating. FIG. 5J shows a multi-level embedded features. FIG. 5K shows two-dimensional structures. FIG. 5L shows a three-dimensional structure having a stack of two sets of gratings. FIG. 5M shows a three-dimensional structure having lines and holes. FIG. 5N shows a three-dimensional blazed grating array.

In some examples, the index resist has a refractive index of approximately 1.5-2.1, and is imprinted over a substrate with an index of approximately 1.5-2.7, to create a surface relief diffractive waveguide. The drop on demand dispense of high index resist is used for imprinting with a controlled RLT (e.g., in a range of 5 nm to 1000 nm) in different zones, and/or to provide for RLT modulation over the waveguide surface in order to change the manner in which light propagates through the eyepiece. In one example, different zones may be created with different RLTs, such as a first RLT zone (e.g., RLT<30 nm) under a first grating height in the CPE optical path, a second RLT zone (e.g., RLT>40 nm) under a second grating height, and a third RLT zone (e.g., RLT<30 nm) over the remainder of the CPE grating height zones, such that the second zone is between the first and third zones. The imprinting may be on one or both sides of a substrate, and may be onto any suitable substrate format such as a wafer, film, sheet, and so forth.

Figure 6A:
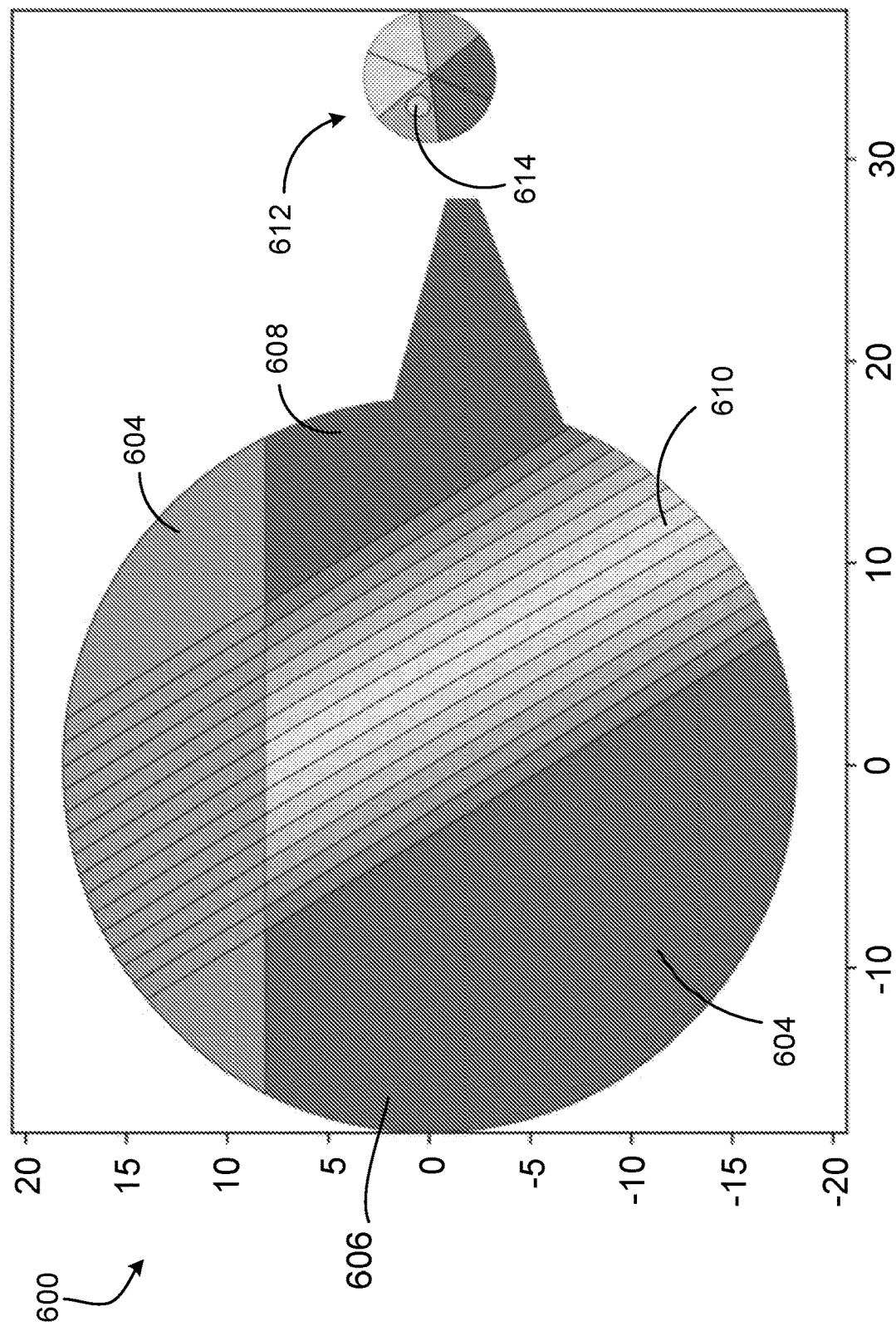
FIGS. 6A and 6B depict an example eyepiece design, according to implementations of the present disclosure.
Figure 6B:
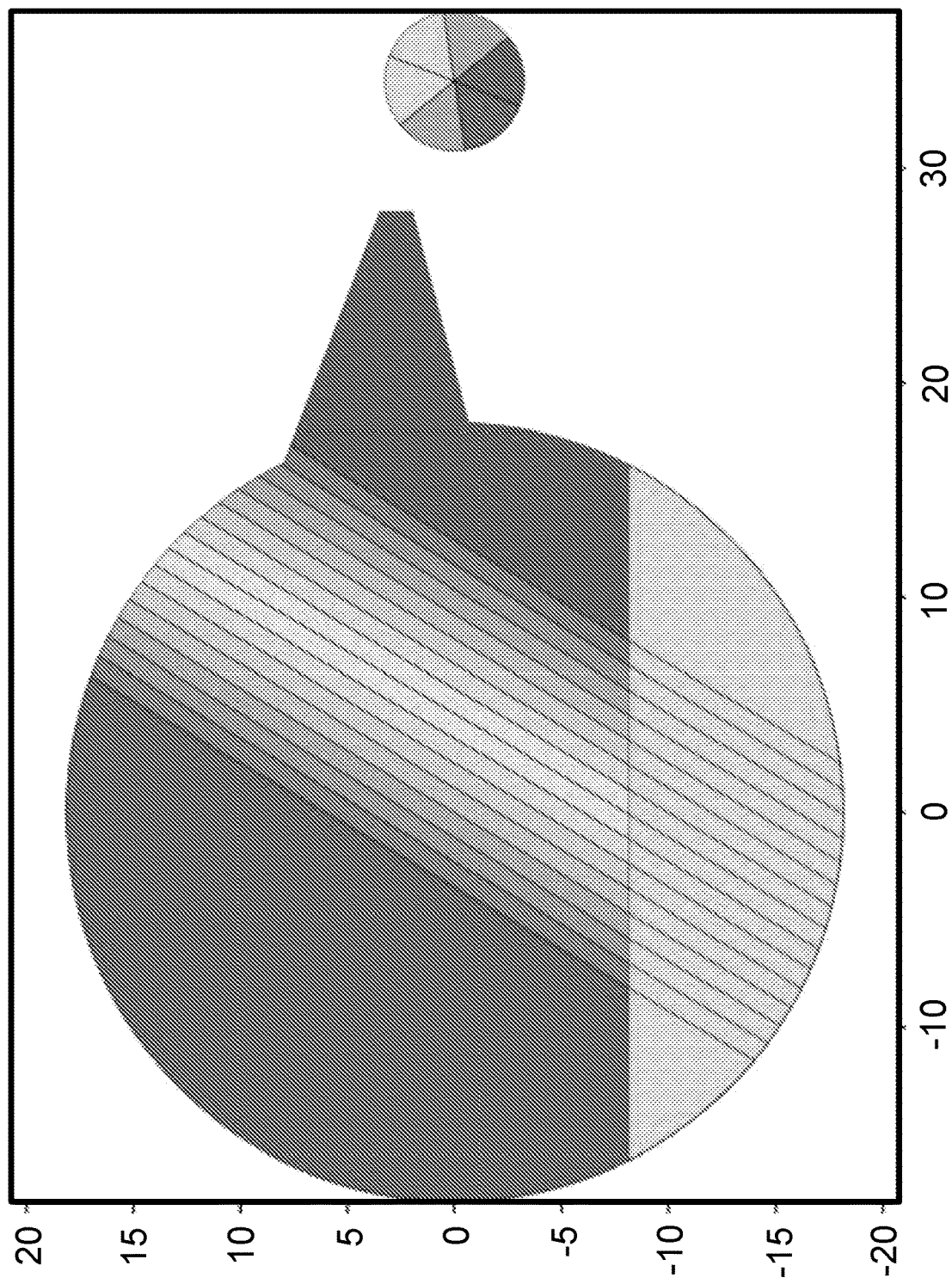

As discussed herein, the imprinting techniques described herein can be used to manufacture waveguides that are used in eyepieces for AR/MR devices, or for other suitable optical apparatuses. FIGS. 6A and 6B depict an example eyepiece design with example dimensions, according to implementations of the present disclosure. FIG. 6A is a schematic 600 of the world side (e.g., outward-facing side) of the example eyepiece design. FIG. 6B is a schematic 650 of the eye side (e.g., inward-facing side) of the example eyepiece design. The scale values on horizontal and vertical axes are in millimeters (mm).

With reference to FIG. 6A, the bottom portion 602 of the example eyepiece design is a CPE region that combines the functionality of an optical pupil expander (OPE) and EPE. The top portion 604 of the design is a recycler region, including a grating that sends back into the eyepiece light that would have otherwise escaped from the eyepiece or been absorbed at the edges of the eyepiece. The diameter of the eyepiece is 36.3 mm in this example. On the left side 606 of the eyepiece, the grating depth is 90 nm. On the right side 608 of the eyepiece, the grating depth is 15 nm. The region 610 in the middle includes multiple zones that have decreasing grating depths from 90 nm on the left to 15 nm on the right. Each of the zones may include thousands of grating lines, and each grating line may be approximately 200 nm wide. Each zone may have a substantially uniform grating depth across that zone. In some examples, the grating depth corresponds to the height of the features, and is measured from the top of the features to their base, with a substantially uniform RLT across various zones and/or regions. Alternatively, the RLT may be different in different zones or regions. The zones have a width of 1 mm, and are inclined at an angle of −30 degrees relative to the vertical. The gratings in these zones are square ridge cross sections that are inclined at −60 degrees relative to the vertical. The region 612 includes multiple pie-slice shaped regions as shown. These regions are anti-reflection structures. One of these regions can include an ICG 614 that is approximately 33 mm from the center of the CPE, as in the example shown.

For the eye side view shown in FIG. 6B, the same dimensions may apply as described with reference to FIG. 6A. The grating groove direction is at +60 degrees, and the depth gradation direction is at an inclination of +30 degrees relative to the vertical.

In some implementations, different grating patterns may be used in different regions. For example, the ICG region may include triangular shaped features in its grating pattern, whereas the CPE region may include binary (e.g., rectangular) shaped features in its grating pattern. Different patterns may be employed to provide different optical effects as desired.

In this example configuration of the eyepiece, the projector that inputs graphics into the eyepiece may be on the right side of the diagram, corresponding to the location of the ICG. Accordingly, the light that is input by the projector may propagate leftward through the waveguide and be output to the user's eye at the various points in the CPE region. The grating depth may increase with increased distance from the projector to provide greater outcoupling power with increased distance from the projector. Given that the propagated light may attenuate somewhat as it travels through the waveguide, the greater grating depth at greater distances from the projector may, overall, lead to a more uniform outcoupling of the light across the surface of the eyepiece.

FIGS. 7A-7E show images of simulated test results for waveguides manufactured using various techniques. The simulation being performed is showing how well different types of waveguides propagate an input image that is uniform across an entire field of view being displayed. The simulation models the same grating pattern being used for all five results, and the changing variable is the RLT. Image 710 in FIG. 7A shows simulated test results of a waveguide manufactured according to the innovative techniques described herein to provide a constant and small RLT across the area of the waveguide. As shown here, the result of a constant and small (e.g., ~20 nm) RLT is that the resulting image is best conveyed to an eye of the user of the optical system, e.g., given an input image that is uniform across the field of view, the result here is substantially reproducing the uniform input test image. The simulation can produce an eye box energy (EBE) score, which describes what percentage of the energy of the input image winds up getting conveyed into the eye box (the region occupied by the eye). The EBE score for 710 is 7.91%. The simulation can also produce a low frequency 80/20 (LF8020) score, which is the 80th percentile brightness minus the 20th percentile brightness, divided by the 50th percentile brightness. Ideally, this score would be zero. The LF8020 score for 710 is 1.32.

FIGS. 7B-7E show simulation results for previously available methods (e.g., spin-on dispensation methods) that are only able to apply a constant volume of resist across the surface of the substrate, and that therefore need to dispense a larger volume of resist to make sure the template is filled completely. Accordingly, these traditional methods generate a product that has thicker and/or less uniform RLT compared to the innovative technique described herein. Image 720 in FIG. 7B shows results of applying a constant volume of resist, with a 20 nm minimum RLT. This simulation has an EBE score of 7.39% and an LF8020 score of 1.70. Image 730 in FIG. 7C shows results of applying a constant volume of resist, with a 30 nm minimum RLT. This simulation has an EBE score of 7.2% and an LF8020 score of 1.77. Image 740 in FIG. 7D shows results of applying a constant volume of resist, with a 40 nm minimum RLT. This simulation has an EBE score of 6.87% and an LF8020 score of 1.956. Image 750 in FIG. 7E shows the results of applying resist with a 200 nm RLT. As shown in the output images, the result of using the innovative techniques described herein is a much more uniform output compared to the other more traditional methods. It is also notable that the simulation here was done with comparison traditional methods assuming RLTs of 20, 30, and 40 nm. This is far lower than what is typical for industry standard techniques currently in use, which tend to produce RLTs of 100-200 nm.

In some embodiments, sub-2 pL dispensing can be achieved by gravity, without the use of pumps. One embodiment includes dispensing drops of a resist on a substrate, contacting the resist with an imprint template to yield a pattern of one or more structures in the resist, wherein the pattern corresponds to the imprint template, polymerizing the resist to yield imprinted nanostructures, and separating the imprint template from the imprinted nanostructures. The resist has an index of refraction in a range of 1.5 to 2.1, a residual layer thickness (RLT) of the resist in at least one portion of the substrate is in a range of 0 nm to 50 nm, and the substrate is composed of an inorganic material.

Implementations of this embodiment can have one or more of the following features.

In some implementations, a volume of each drop of the resist is less than 6 picoliters, less than 5 picoliters, less than 4 picoliters. 3 picoliters, or less than 2 picoliters. In some implementations, a volume of each drop of the resist is less than 1 picoliter.

In some implementations, the RLT of the resist in at least one portion of the substrate is in a range of 0 to 10 nm, 10 to 20 nm, 20 to 30 nm, 30 to 40 nm, or 40 to 50 nm. In some implementations, the RLT of the resist in at least one portion of the substrate is in a range of 0 to 40 nm, 0 to 30 nm, 0 to 20 nm, or 0 to 10 nm. In some implementations, the RLT of the resist in at least one portion of the substrate is in a range of 10 to 40 nm or 10 to 30 nm. In some implementations, the RLT of the resist in at least one portion of the substrate is in a range of 20 to 40 nm.

In some implementations, the substrate comprises glass, $LiTaO_3$, $LiNbO_3$, SiC, or a combination thereof.

In some implementations, the resist is free of inorganic nanoparticles. In this case, the resist has an index of refraction typically in a range of 1.5 to 1.8.

In some implementations, the resist comprises inorganic nanoparticles (e.g., $TiO_2$, $ZrO_2$, or both). An average diameter of the inorganic nanoparticles is typically in a range of 5 nm to 15 nm. The inorganic nanoparticles can make up about 10 vol % to about 60 vol % of the resist. The resist typically has an index of refraction in a range of 1.5 to 2.1.

In some implementations, a viscosity of the resist is in a range of 5-25 centiPoise (cP) at 25° C.

In some implementations, a surface tension of the resist is in a range of 20-60 milliNewton (mN) per meter (m) at 25° C.

In some implementations, dispensing the drops of the resist comprises pumping the resist from a reservoir to a fluid dispenser through a first channel. Some implementations include maintaining a continuous flow of the resist between the reservoir and the fluid dispenser. In some implementations, maintaining the continuous flow of the resist between the reservoir and the fluid dispenser includes pumping undispensed resist from the fluid dispenser to the reservoir through a second channel.

EMBODIMENTS OF THE DISCLOSURE

Embodiment 1 is a system for manufacturing an optical device, the system comprising:
a reservoir configured to store resist;
a fluid dispenser that includes an dispensing mechanism configured to dispense drops of the resist onto a substrate;
a meniscus pump configured to cause movement of the resist from the reservoir to the fluid dispenser through a first channel;
a fluid pump configured to cause movement of undispensed resist from the fluid dispenser to the reservoir through a second channel;
a fluid control device that is communicatively coupled to the fluid pump and the meniscus pump, the fluid control device configured to control the operation of the fluid pump and the meniscus pump to maintain a continuous flow of the resist between the reservoir and the fluid dispenser; and
an imprint mechanism that operates to create the optical device by applying an imprint template to the resist that has been dispensed onto the substrate, wherein applying the imprint template creates a pattern of one or more structures in the resist, wherein the pattern corresponds to the imprint template.

Embodiment 2 is the system of embodiment 1, further comprising:
a control module that is communicatively coupled to the fluid control device, the fluid dispenser, and the imprint mechanism, the control module programmed to send signals that control operations of the fluid control device, the fluid dispenser, and the imprint mechanism.

Embodiment 3 is the system of embodiments 1 or 2, wherein the fluid dispenser is configured to dispense drops of the resist having a volume that is less than 6 picoliters.

Embodiment 4 is the system of embodiment 3, wherein the fluid dispenser is configured to dispense drops of the resist having a volume that is less than 4 picoliters.

Embodiment 5 is the system of embodiment 4, wherein the fluid dispenser is configured to dispense drops of the resist having a volume that is less than 2 picoliters.

Embodiment 6 is the system of any one of embodiments 1-5, wherein the resist has a refractive index greater than 1.6 for light with a wavelength of 532 nanometers.

Embodiment 7 is the system of any one of embodiments 1-6, wherein the substrate has a refractive index in a range of 1.5 to 2.7.

Embodiment 8 is the system of any one of embodiments 1-7, wherein the imprint template includes at least two zones having structures of different heights.

Embodiment 9 is a method for manufacturing an optical device, the method comprising:
operating a fluid dispenser that includes an dispensing mechanism to dispense drops of resist onto a substrate;
operating a meniscus pump to cause movement of the resist from a reservoir to the fluid dispenser through a first channel;
operating a fluid pump to cause movement of undispensed resist from the fluid dispenser to the reservoir through a second channel, wherein the fluid pump and the meniscus pump operate to maintain a continuous flow of the resist between the reservoir and the fluid dispenser; and
operating an imprint mechanism to create the optical device by applying an imprint template to the resist that has been dispensed onto the substrate, wherein applying the imprint template creates a pattern of one or more structures in the resist, wherein the pattern corresponds to the imprint template.

Embodiment 10 is the method of embodiment 9, further comprising:
etching at least a portion of the optical device to reduce a residual layer thickness (RLT) of the resist on the substrate, wherein the etching includes one or more of an application of heat or an atmospheric etching.

Embodiment 11 is the method of embodiment 10, wherein the etching further reduces a dimension of at least one structure of the pattern created by applying the imprint template.

Embodiment 12 is a waveguide comprising:
a substrate; and
a plurality of structures imprinted into a volume of resist that dispensed onto the substrate, wherein the resist is composed of a polymer, wherein the resist has an index of refraction in a range of 1.5 to 2.1, and wherein a residual layer thickness (RLT) of the resist in at least one portion of the substrate is in a range of 0 nm to 50 nm.

Embodiment 13 is the waveguide of embodiment 12, wherein the RLT of the resist in at least one portion of the substrate is in a range of 10 to 20 nm.

Embodiment 14 is the waveguide of embodiment 12, wherein the RLT of the resist in at least one portion of the substrate is in a range of 20 to 30 nm.

Embodiment 15 is the waveguide of embodiment 12, wherein the RLT of the resist in at least one portion of the substrate is in a range of 30 to 40 nm.

Embodiment 16 is the waveguide of embodiment 12, wherein the RLT of the resist in at least one portion of the substrate is in a range of 40 to 50 nm.

Embodiment 17 is the waveguide of any one of embodiments 12-16, wherein the plurality of structures provide one or more optically active zones that include one or more of an input coupler, a combined pupil expander, an exit pupil expander, an orthogonal pupil expander, a recycler, or an anti-reflective feature.

Embodiment 18 is the waveguide of any one of embodiments 12-17, wherein the plurality of structures are imprinted with a nanogeometry that includes one or more of a binary geometry, a slanted geometry, a blazed geometry, a sawtooth geometry, a multi-step geometry, a meta feature geometry, a one-dimensional geometry, a two-dimensional geometry, or a three-dimensional geometry.

Embodiment 19 is the waveguide of any one of embodiments 12-18, wherein the substrate index of refraction is in a range of 1.5 to 2.7.

Embodiment 20 is the waveguide of any one of embodiments 12-19, wherein the plurality of structures is imprinted onto a single side of the substrate.

Embodiment 21 is the waveguide of any one of embodiments 12-19, wherein the plurality of structures is imprinted onto two sides of the substrate.

Embodiment 22 is an imprint lithography method comprising:
dispensing drops of a resist on a substrate; and
contacting the resist with an imprint template to yield a pattern of one or more structures in the resist, wherein the pattern corresponds to the imprint template;
polymerizing the resist to yield imprinted nanostructures; and
separating the imprint template from the imprinted nanostructures,
wherein:

the resist has an index of refraction in a range of 1.5 to 2.1, a residual layer thickness (RLT) of the resist in at least one portion of the substrate is in a range of 0 nm to 50 nm, and the substrate is composed of an inorganic material.

Embodiment 23 is the imprint lithography method of embodiment 22, wherein a volume of each drop of the resist is less than 6 picoliters, less than 5 picoliters, less than 4 picoliters. 3 picoliters, or less than 2 picoliters.

Embodiment 24 is the imprint lithography method of embodiment 23, wherein a volume of each drop of the resist is less than 1 picoliter.

Embodiment 25 is the imprint lithography method of any one of embodiments 22-24, wherein the RLT of the resist in at least one portion of the substrate is in a range of 0 to 10 nm, 10 to 20 nm, 20 to 30 nm, 30 to 40 nm, or 40 to 50 nm.

Embodiment 26 is the imprint lithography method of any one of embodiments 22-24, wherein the RLT of the resist in at least one portion of the substrate is in a range of 0 to 40 nm, 0 to 30 nm, 0 to 20 nm, or 0 to 10 nm.

Embodiment 27 is the imprint lithography method of any one of embodiments 22-24, wherein the RLT of the resist in at least one portion of the substrate is in a range of 10 to 40 nm or 10 to 30 nm.

Embodiment 28 is the imprint lithography method of any one of embodiments 22-24, wherein the RLT of the resist in at least one portion of the substrate is in a range of 20 to 40 nm.

Embodiment 29 is the imprint lithography method of any one of embodiments 22-28, wherein the substrate comprises glass, $LiTaO_3$, $LiNbO_3$, SiC, or a combination thereof.

Embodiment 30 is the imprint lithography method of any one of embodiments 22-29, wherein the resist is free of inorganic nanoparticles.

Embodiment 31 is the imprint lithography method of embodiment 30, wherein the resist has an index of refraction in a range of 1.5 to 1.8.

Embodiment 32 is the imprint lithography method of any one of embodiments 22-29, wherein the resist comprises inorganic nanoparticles.

Embodiment 33 is the imprint lithography method of embodiment 32, wherein the inorganic nanoparticles comprise $TiO_2$, $ZrO_2$, or both.

Embodiment 34 is the imprint lithography method of embodiment 32 or 33, wherein an average diameter of the inorganic nanoparticles is in a range of 5 nm to 15 nm.

Embodiment 35 is the imprint lithography method of any one of embodiments 32-34, wherein the inorganic nanoparticles comprise 10 vol % to 60 vol % of the resist.

Embodiment 36 is the imprint lithography method of any one of embodiments 32-35, wherein the resist has an index of refraction in a range of 1.5 to 2.1.

Embodiment 37 is the imprint lithography method of any one of embodiments 22-36, wherein a viscosity of the resist is in a range of 5-25 centiPoise (cP) at 25° C.

Embodiment 38 is the imprint lithography method of any one of embodiments 22-37, wherein a surface tension of the resist is in a range of 20-60 milliNewton (mN) per meter (m) at 25° C.

Embodiment 39 is the imprint lithography method of any one of embodiments 22-38, wherein dispensing the drops of the resist comprises pumping the resist from a reservoir to a fluid dispenser through a first channel.

Embodiment 40 is the imprint lithography method of any one of embodiments 22-39, further comprising maintaining a continuous flow of the resist between the reservoir and the fluid dispenser.

Embodiment 41 is the imprint lithography method of embodiment 40, wherein maintaining the continuous flow of the resist between the reservoir and the fluid dispenser comprises pumping undispensed resist from the fluid dispenser to the reservoir through a second channel.

Embodiment 42 is the imprint lithography method of any one of embodiments 22-38, wherein dispensing the drops occurs without pumping of the resist.

Embodiment 43 is the imprint lithography method of embodiment 42, wherein dispensing the drops occurs without pumping the resist with a meniscus pump, a fluid pump, or both.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A system for manufacturing an optical device, the system comprising:
    a reservoir configured to store resist;
    a fluid dispenser that includes an dispensing mechanism configured to dispense drops of the resist onto a substrate;
    a meniscus pump configured to cause movement of the resist from the reservoir to the fluid dispenser through a first channel;
    a fluid pump configured to cause movement of undispensed resist from the fluid dispenser to the reservoir through a second channel;
    a fluid control device that is communicatively coupled to the fluid pump and the meniscus pump, the fluid control device configured to control the operation of the fluid pump and the meniscus pump to maintain a continuous flow of the resist between the reservoir and the fluid dispenser; and an imprint mechanism that operates to create the optical device by applying an imprint template to the resist that has been dispensed onto the substrate, wherein applying the imprint template creates a pattern of one or more structures in the resist, wherein the pattern corresponds to the imprint template.

2. The system of claim 1, further comprising:
a control module that is communicatively coupled to the fluid control device, the fluid dispenser, and the imprint mechanism, the control module programmed to send signals that control operations of the fluid control device, the fluid dispenser, and the imprint mechanism.

3. The system of claim 1, wherein the fluid dispenser is configured to dispense drops of the resist having a volume that is less than 2 picoliters.

4. The system of claim 1, wherein the fluid dispenser is configured to dispense drops of the resist having a volume that is less than 4 picoliters.

5. The system of claim 1, wherein the fluid dispenser is configured to dispense drops of the resist having a volume that is less than 6 picoliters.

6. The system of claim 1, wherein the resist has an index of refraction greater than 1.6 for light with a wavelength of 532 nanometers.

7. The system of claim 1, wherein the substrate has an index of refraction in a range of 1.5 to 2.7.

8. The system of claim 1, wherein the imprint template includes at least two zones having structures of different heights.

9. A method for manufacturing an optical device, the method comprising:
operating a fluid dispenser that includes an dispensing mechanism to dispense drops of resist onto a substrate;
operating a meniscus pump to cause movement of the resist from a reservoir to the fluid dispenser through a first channel;
operating a fluid pump to cause movement of undispensed resist from the fluid dispenser to the reservoir through a second channel, wherein the fluid pump and the meniscus pump operate to maintain a continuous flow of the resist between the reservoir and the fluid dispenser; and
operating an imprint mechanism to create the optical device by applying an imprint template to the resist that has been dispensed onto the substrate, wherein applying the imprint template creates a pattern of one or more structures in the resist, and the pattern corresponds to the imprint template.

10. The method of claim 9, further comprising:
etching at least a portion of the optical device to reduce a residual layer thickness (RLT) of the resist on the substrate, wherein the etching includes one or more of an application of heat or an atmospheric etching.

11. The method of claim 10, wherein the etching further reduces a dimension of at least one structure of the pattern created by applying the imprint template.

* * * * *